United States Patent

Kunze-Concewitz

[11] Patent Number: 5,964,952
[45] Date of Patent: Oct. 12, 1999

[54] METHOD OF CLEANING SURFACES WITH WATER AND STEAM

[76] Inventor: Horst Kunze-Concewitz, Waldenser Strasse 41, D-75446 Wiernsheim, Germany

[21] Appl. No.: 08/809,703
[22] PCT Filed: Sep. 28, 1995
[86] PCT No.: PCT/EP95/03838
§ 371 Date: Jun. 9, 1997
§ 102(e) Date: Jun. 9, 1997
[87] PCT Pub. No.: WO96/10463
PCT Pub. Date: Apr. 11, 1996

[30] Foreign Application Priority Data

| Oct. 4, 1994 | [DE] | Germany | 44 35 414 |
| Nov. 30, 1994 | [DE] | Germany | 44 42 582 |
| Feb. 24, 1995 | [DE] | Germany | 195 06 594 |
| Jun. 23, 1995 | [DE] | Germany | 195 22 525 |

[51] Int. Cl.$^6$ ................................. B08B 3/00
[52] U.S. Cl. .................. 134/2; 134/15; 134/30; 134/32; 134/33; 134/34; 134/35; 134/37; 134/99.1; 134/103.2; 134/103.3; 134/144; 134/151; 134/153; 134/902
[58] Field of Search ................. 134/2, 15, 30, 134/32, 33, 34, 35, 37, 99.1, 103.2, 103.3, 144, 151, 153, 902

[56] References Cited

U.S. PATENT DOCUMENTS

| 4,414,037 | 11/1983 | Friedheim | 134/35 |
| 4,527,843 | 7/1985 | Murdoch | 312/31.2 |
| 5,029,595 | 7/1991 | Hautau | 134/142 |
| 5,051,136 | 9/1991 | Tuominen | 134/15 |
| 5,058,610 | 10/1991 | Kuriyama | 134/98 |
| 5,113,882 | 5/1992 | Gileta | 134/19 |
| 5,187,831 | 2/1993 | French | 15/302 |
| 5,203,360 | 4/1993 | Nguyen et al. | 134/78 |
| 5,203,927 | 4/1993 | Yoshida et al. | 134/21 |
| 5,275,849 | 1/1994 | Castelli et al. | 427/461 |
| 5,346,557 | 9/1994 | Ito et al. | 134/10 |
| 5,361,789 | 11/1994 | Yoshida et al. | 134/68 |

FOREIGN PATENT DOCUMENTS

| 0 381 435 | 8/1990 | European Pat. Off. . |
| 0 455 465 | 11/1991 | European Pat. Off. . |
| 0 548 504 | 6/1993 | European Pat. Off. . |

OTHER PUBLICATIONS

Patent Abstracts of Japan JP59215729 (Nippon Shinku Gijutsu KK) Dec. 5, 1984, vol. 9, No. 85 (E–308), Apr. 13, 1985.
Patent Abstracts of Japan/JP4315429 (Hitachi Ltd) Nov. 6, 1992, vol. 17, No. 150 (E–1339) Mar. 25, 1993.
Patent Abstracts of Japan/JP62060225 (Toshiba Ceramics Co Ltd) Mar. 16, 1987, vol. 11, No. 245 (E–531) Aug. 11, 1987.
Patent Abstracts of Japan/JP56103439 (Mitsubishi Electric Corp) Aug. 18, 1981, vol. 5, No. 176 (E–81) Nov. 12, 1981.
Patent Abstracts of Japan/JP70337866 (Fujitsu Ltd) Feb. 7, 1995, vol. 950, No. 2.
IBM Technical Disclosure Bulletin, vol. 20, No. 3, Aug. 1977, p. 950, G.A. Deighton "Steam and Water Spray Wafer Cleaning".

*Primary Examiner*—Jill Warden
*Assistant Examiner*—S. Carrillo
*Attorney, Agent, or Firm*—Jones, Tullar & Cooper, P.C.

[57] ABSTRACT

A method and device for cleaning contaminated surfaces with both water and steam. A water film is applied to the contaminated surface and steam sprayed into the water film while water is continued to be applied to the water film. In this way the steam is directed into the water film and through the water film onto the contaminated surface, whereby contaminates in the contaminated surface are removed.

13 Claims, 8 Drawing Sheets

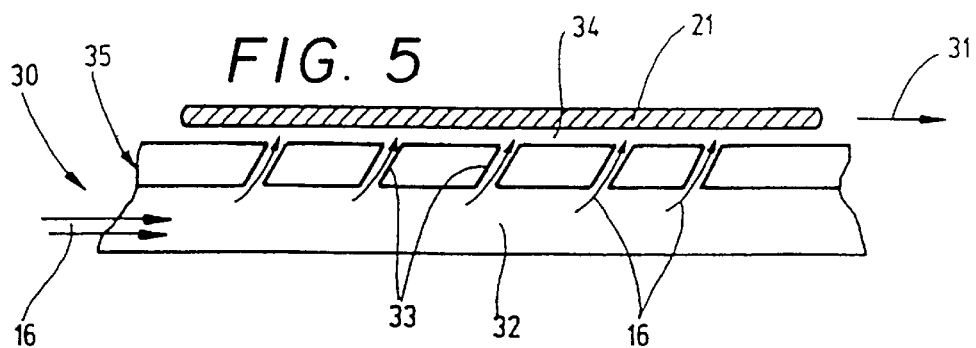
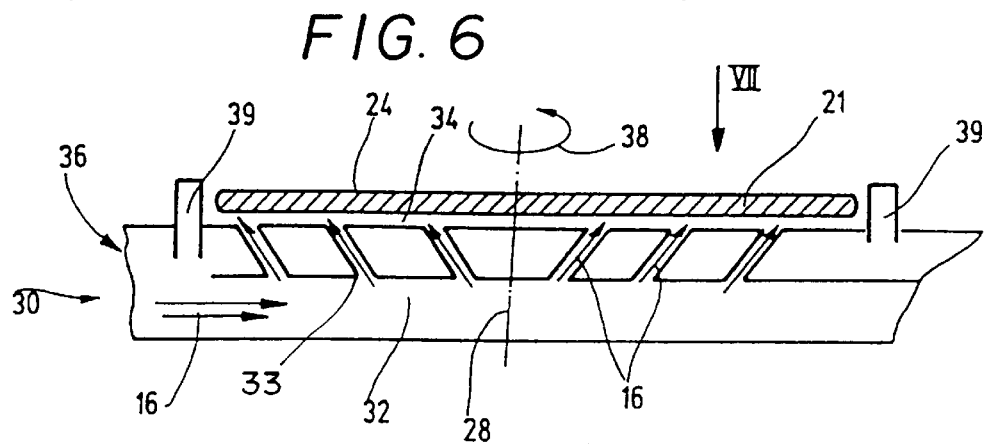
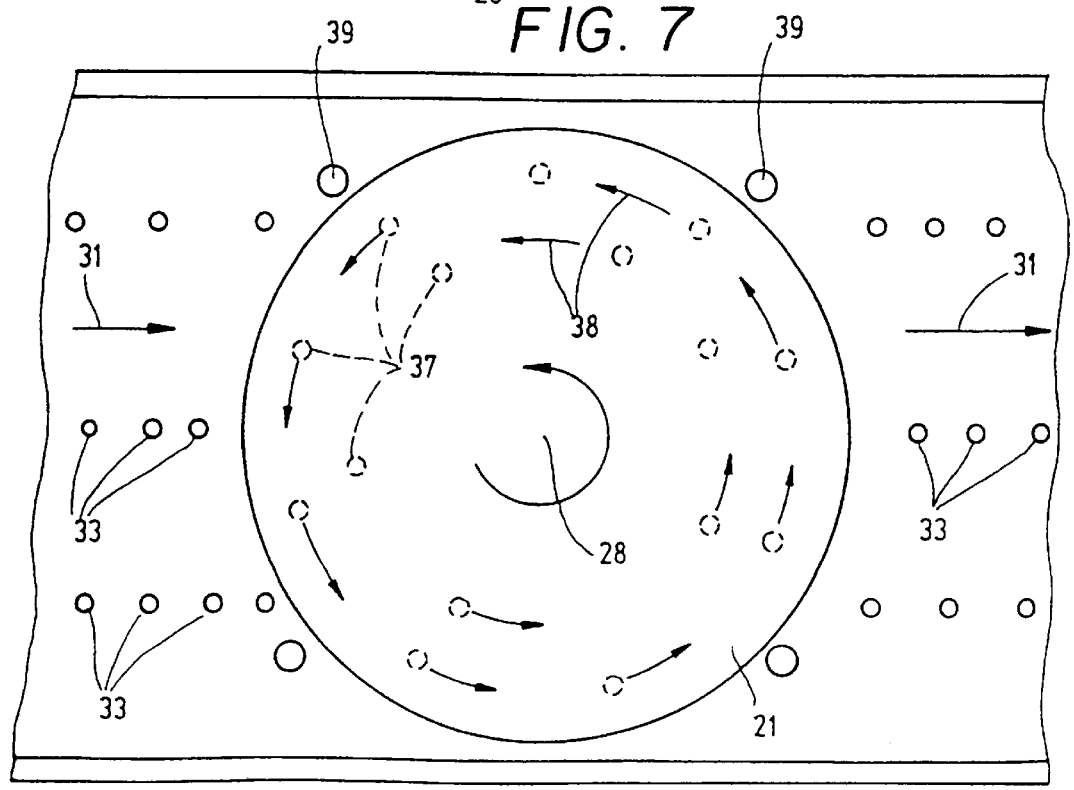

METHOD OF CLEANING SURFACES WITH WATER AND STEAM

FIELD OF THE INVENTION

The present invention relates to a method for super-cleaning surfaces, and to a device in accordance with the preamble of for executing this method.

BACKGROUND OF THE INVENTION

Conventional cleaning methods are based in immersion of the surface of the article or substrate to be cleaned into a wet bath, filled with detergent for cleaning, and, for instance reinforced by ultrasound, or by immersion of the substrate in vapor atmospheres, or by mechanical treatment of the surface, for instance by brushing, spraying of water or detergent at high pressure from spray nozzles, or by vibrational excitation vibration (megasonic cleaning).

Particularly in chip manufacture, planarization is a process step that is gaining ever greater significance as the miniaturization of structures progresses. The structured surfaces of a substrate (for instance of a silicon wafer) are ground or lapped flat by a chemical-mechanical polishing step (or CMP processing step), using fine grinding agents (slurry). These grinding agents have an extremely small particle size, with the attendant disadvantage that after the grinding process, individual grinding particles still adhere to the machined surface and are partly embedded in the surface. After the grinding process, the surface must be freed completely of grinding agents and other contaminants so that the substrate can be further machined.

As already noted above, by means of brushes, water and by spraying water at high pressures of up to 50 bar, an attempt is made to remove the grinding agent residues. The brushes have the substantial disadvantage that they must be constantly wetted with water and that they gradually fill up with the removed grinding agents. The brushes must therefore be replaced regularly, which in turn has the disadvantage that by intervention with the cleaning station on replacement of the brushes, the cleaning station becomes contaminated. Mechanically treating the surface to be cleaned with the brushes also involves the danger that the surface will become damaged and in particular scratched. As a rule, the cleaning process with the brushes is followed by a further cleaning process in which water is sprayed at high pressure. If good results are to be obtained, the surface to be cleaned must be exposed to the spray for a certain period of time and stopped repeatedly, which makes for a long cleaning time.

The disadvantages of the conventional method will be listed again below. Along with major brush wear and hence high costs for the brushes, frequent brush changing involves a necessary intervention into the machine and hence a machine shutdown. Because the brushes become filled with particles, damage to the surface by scratching must be feared, and the fact that the brushes (the brush material is PFA sponge) are kept permanently wet means major consumption of deionized water. Moreover, designing the cleaning chamber with brush cleaning for cleaning both sides of the substrate is complicated and expensive. The contact pressure of the sponge brushes cannot be adjusted replicably. In high-pressure cleaning, there is the risk of electrostatic charging of the substrate, since nonconductive deionized water is used. With megasonic cleaning, the surface cannot be cleaned completely, especially after grinding processes.

From European Patent Disclosure EP0381435A2, a method and a device for washing printed circuit boards is known. Steam is sprayed at the boards at a temperature and a pressure at which the steam undergoes no change of phase.

Japanese reference JP-A 703 7866 discloses a device with which an article is exposed to an atmosphere of steam enriched with $NO_2$.

SUMMARY OF THE INVENTION

It is therefore an object of the invention to provide a method and/or a device available, by means of which contaminated surfaces can be cleaned more simply, at lower cost and more rapidly, as well as with increased protection from damage.

This object is attained in accordance with the present invention in that in the method aspect at least one steam nozzle is brought into the immediate vicinity of the surface, and in that the steam is directed in a targeted way to the surface to be cleaned via the nozzle, and the surface to be cleaned is moistened with water simultaneously with or prior to the spraying with steam.

The device aspect in accordance with the present invention has the essential advantage that the surface to be cleaned is not mechanically treated, and the adhering particles of the grinding paste which are to be removed are on the one hand loosened by means of the heat energy introduced via the steam. Because of the different heat absorption of the substrate and the particles to be removed, and because of tension caused by different coefficients of expansion, the connection between the particles and the substrate is weakened, as a result of which the particles are loosened from the surface to be cleaned. If wet steam is used in place of superheated steam, the particles are additionally loosened by the transfer of pulse forces. In the process the kinetic energy (ultrasound energy) when the liquid droplets impinge is utilized. A further advantage resides in that in the course of introducing the steam into a water film present on the surface, the water partially turns into steam locally, and the vapor bubbles either collapse again immediately afterwards or burst on the surface of the water film.

The method in accordance with the present invention can be employed not only with flat or plane surfaces, but also with deep structures, such as occur in the production of micro-mechanical elements, for example. The removal of the loosened particles can take place either by means of the steam directed on the surface, by the condensate, and/or by additionally sprayed-on water. This is of advantage in particular with very thin substrates, since only little condensation takes place there.

In a further development it is provided that the surface can be dried at the end, for example by the introduction of foreign gas, such as nitrogen or the like, or by employing hot steam. Spots left after drying are thus averted. It is considered to be particularly important that the removal of the particles takes place by means of the action of pulses (kinetic energy), by different heat expansion (thermal energy) and by means of the action of pulses (water turning into steam and bursting of the gas bubbles). In this connection, blowing of steam into a water film is preferred.

Advantages are seen in the employment of deionized water, to which alcohols, detergents, solvents or the like can be added. Foreign gases, for example nitrogen or the like, can be added to the steam. One particular area of application is considered to be the cleaning which follows the CMP process, but others are also in connection with the manufacture of LCD products, production of hard disks, and in micro-mechanics or other processes requiring super-clean surfaces.

A transport device is provided in accordance with the present invention, by means of which objects, for example substrates whose surface needs to be cleaned, are rotated and/or conveyed. In the case of silicon wafers the objects are, for example, flat disks, which are transported without contact through the cleaning station in a continuous running process. In the process both the top and the bottom are cleaned. The two sides can be cleaned simultaneously or one after the other. In the process the object preferably rotates on a steam and/or water cushion and is maintained contactless in this way. The position is fixed by pins or rollers acting on the edge of the disk. The substrate is caused to rotate and/or is transported through the cleaning station by appropriately disposed nozzles on the transport device, which are directed on the underside of the disks. The oblique impact angle of the fluids leaving the nozzles has been selected such, that disk is moved in any case, possibly even cleaned in addition. The impacting fluid is therefore used as a transport medium, cleaning medium and removal medium for loosened particles. The runoff of the fluids is made easier, for example by transverse grooves or obliquely extending grooves in the transport device.

A drying section, in which the substrate is dried, can follow the section of the cleaning station where cleaning takes place. In the process the substrate is preferably caused to rotate (1500 rpm), by means of which the adhering water film is thrown off, drying can also be aided by hot steam. The individual substrates can be inserted into magazines or cassettes at the outlet from the cleaning station.

The advantages of the method in accordance with the present invention and the device in accordance with the present invention are essentially the following: improved cleaning results at higher eater temperatures; shorter process times and attendant higher throughput; contactless cleaning and therefore no mechanical stress of the substrate surface; no disposable articles such as brushes, etc., and therefore reduced operating costs; no interference with the cleaning chamber and therefore no down times and no danger of contamination; no cleaning of the process chamber is required, since it is automatically also cleaned by the steam; smaller size of the installation and lesser need for clean rooms; simpler structure of the process chamber, reproducible cleaning results in contrast to the customary processes, in which the brushes are used up; easier integration in a cluster with other installations; and environmentally friendly cleaning, since in contrast to cleaning by the CMP process no solvents are involved.

Further advantages, characteristics and details of the present invention will become apparent from the claims and the ensuing description, in which especially preferred exemplary embodiments are shown in detail in conjunction with the drawing. the description and shown in a drawing may each be essential to the invention individually or in arbitrary combination.

Shown in the drawing are:

Figure 8:
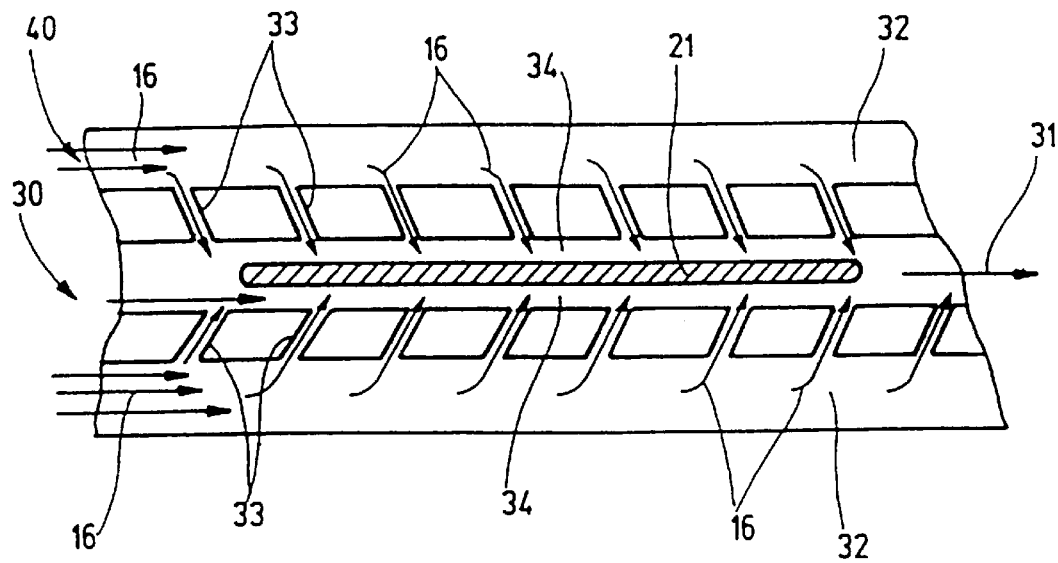
Figure 9:
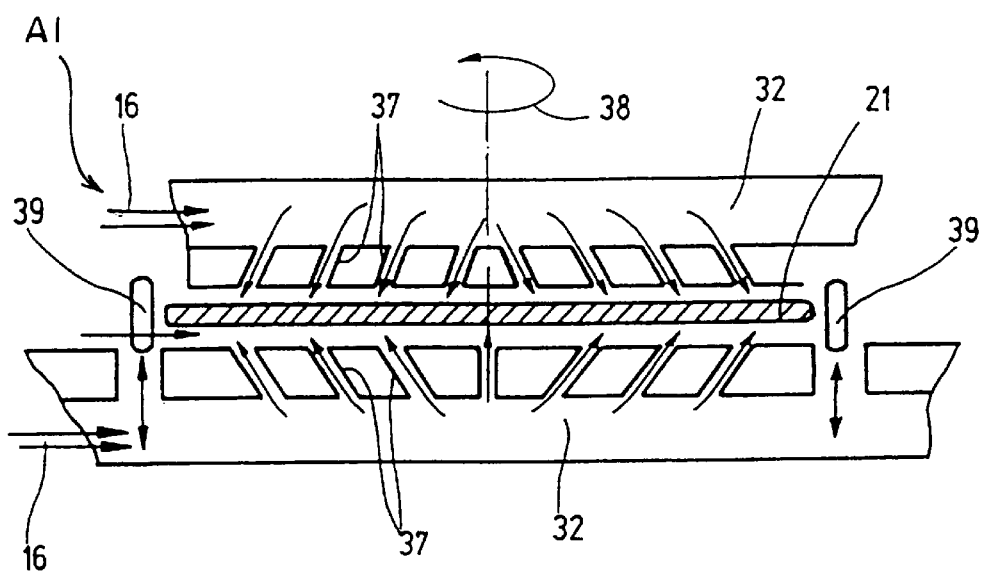
Figure 10:
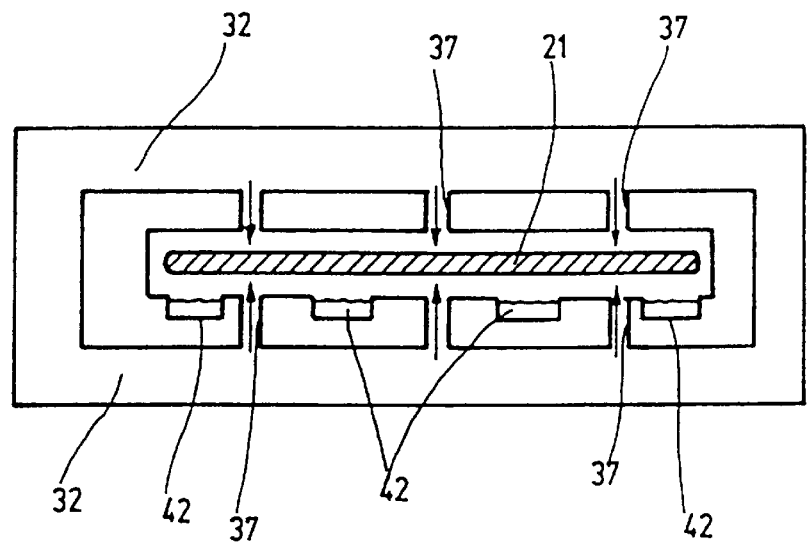
Figure 11:
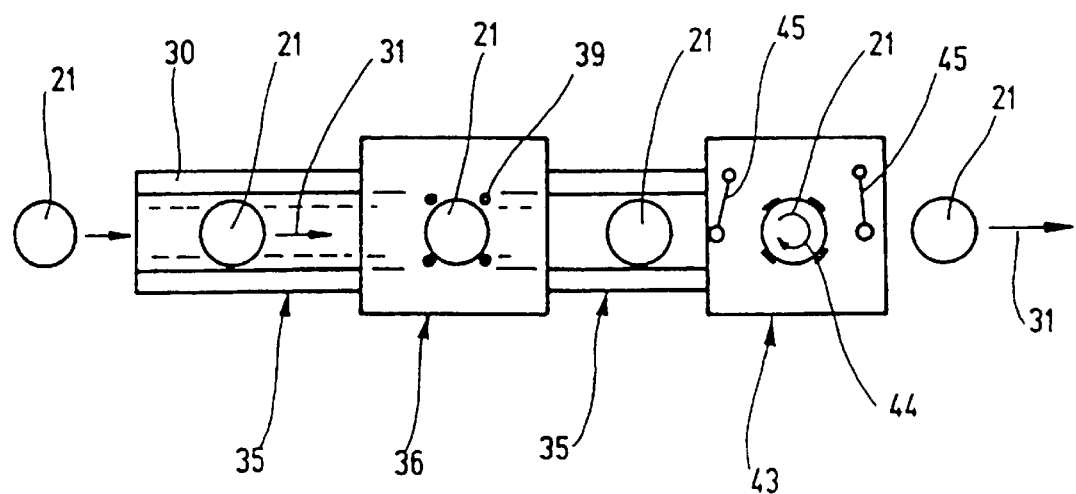
Figure 12:
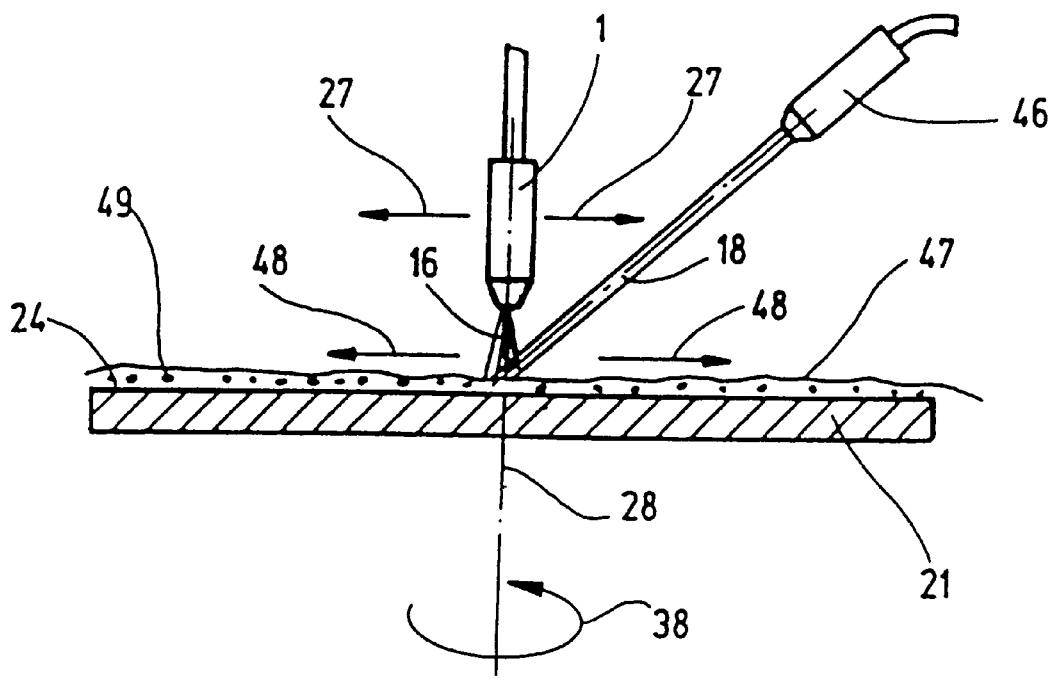
Figure 13:
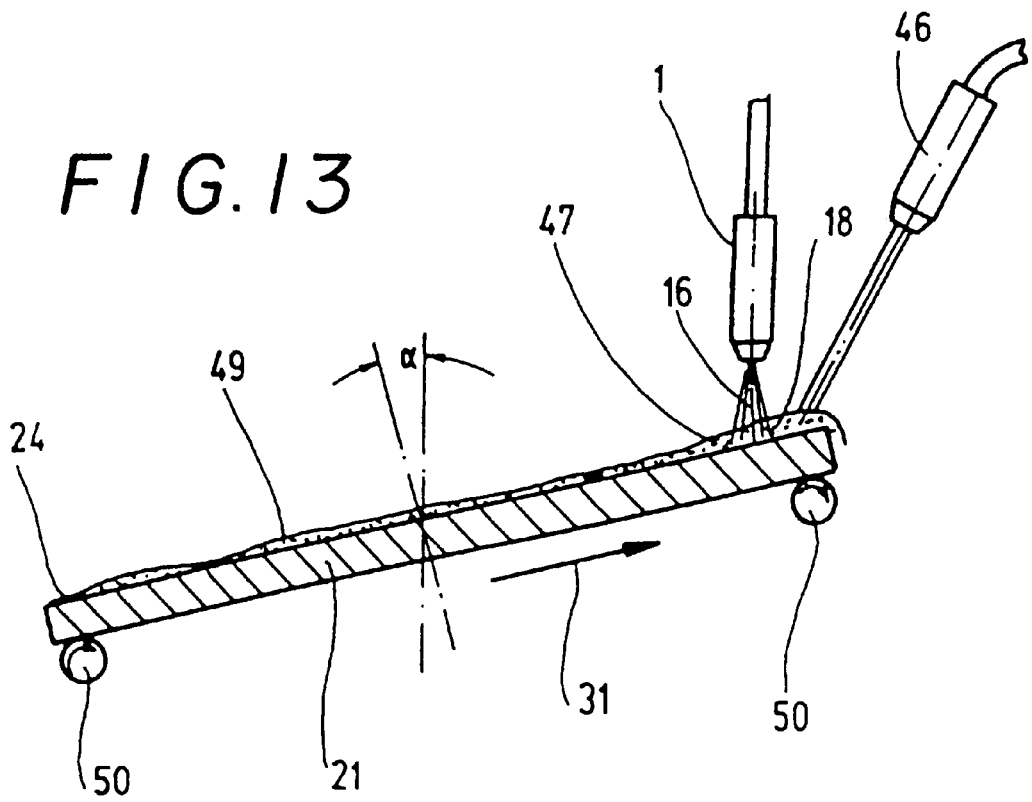
Figure 14:
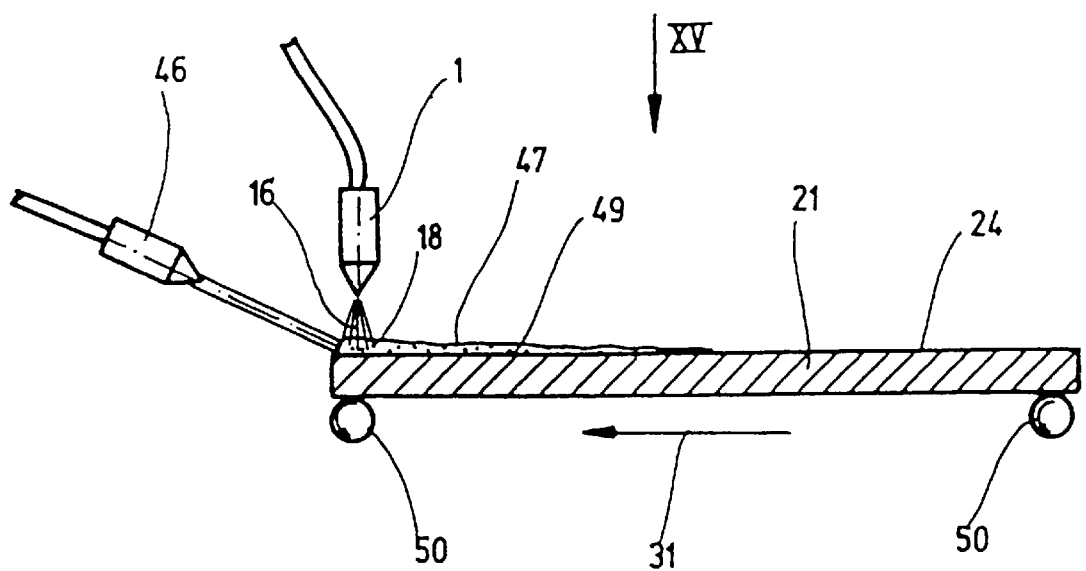
Figure 15:
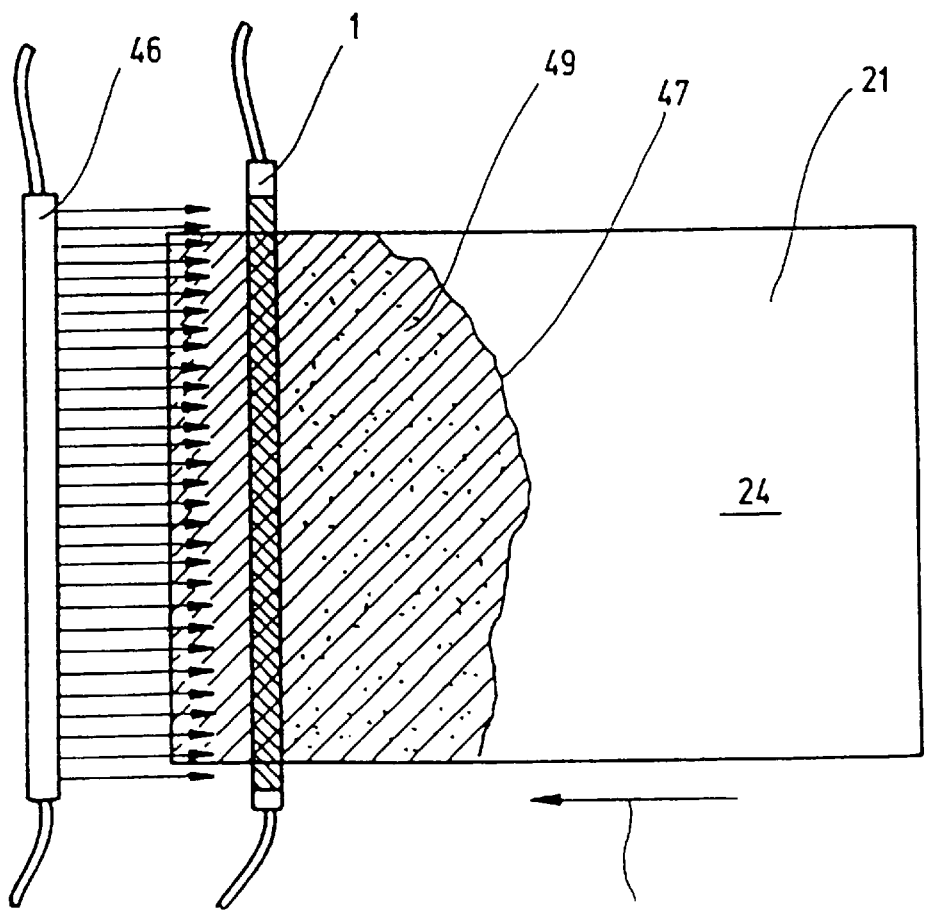

FIG, 4, is a second embodiment of the cleaning device according to the present invention;

FIG. 5, is a first embodiment of a transport device according to the present invention;

FIG. 6, is a second embodiment of a transport device according to the present invention;

FIG. 7, is a plan view on the transport device of FIG. 6 in the direction of the arrow VII;

FIG. 8, is a third embodiment of the transport device according to the present invention;

FIG. 9, is a fourth embodiment of the transport device according to the present invention;

FIG. 10, is a fifth embodiment of the transport device according to the present invention;

FIG. 11, is a basic illustration of a cleaning station;

FIG. 12, is an illustration of a first method for cleaning contaminated surfaces;

FIG. 13, is an illustration of a second method for cleaning contaminated surfaces;

FIG. 14, is an illustration of a third method for cleaning contaminated surfaces;

FIG. 15, is a plan view of the illustration of FIG. 14 in the direction of the arrow XV.

DESCRIPTION OF THE PREFERRED EMBODIMENTS

Figure 1:
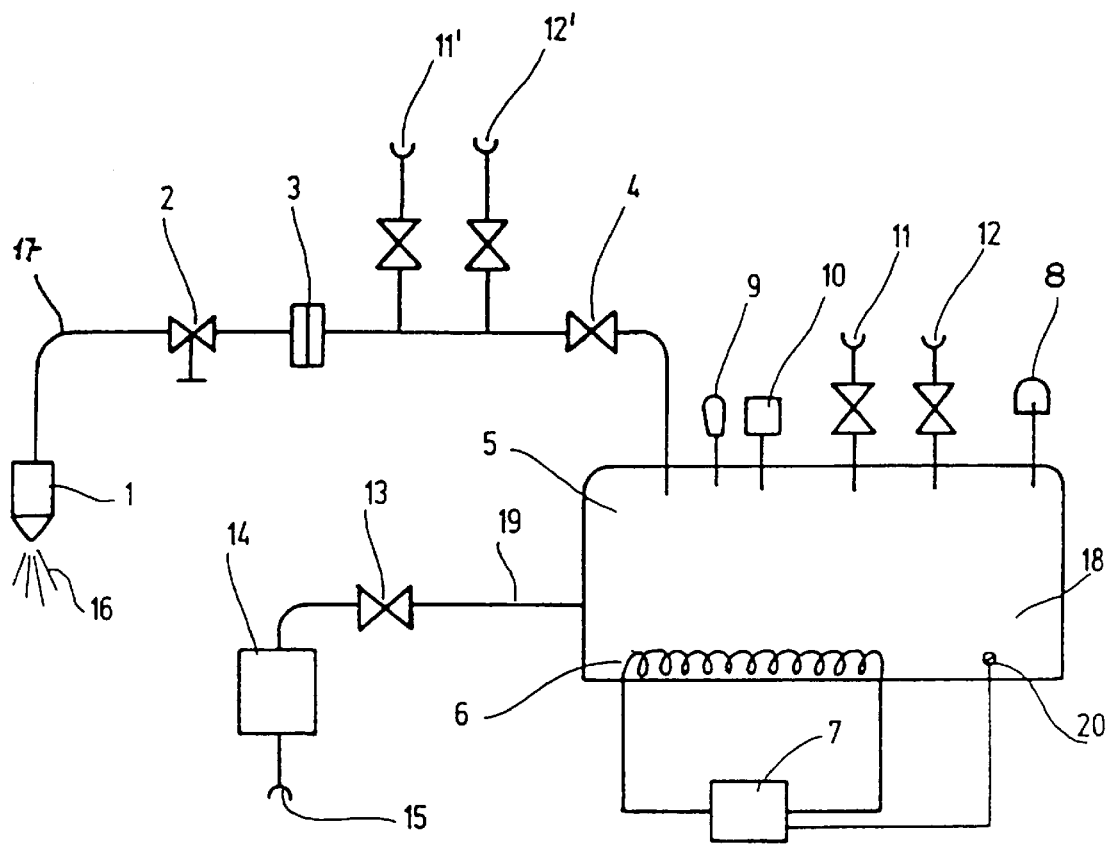
FIG. 1, is a basic sketch of a device for generating steam.

In FIG. 1, a basic sketch is shown for preparing the steam to be used to clean contaminated surfaces. Reference numeral 1 indicates a spray nozzle from which steam 16 emerges in the form of superheated steam or wet steam. The nozzle 1 communicates via a line 17 with a steam boiler 5. Provided in the line 17 in succession are a steam vale 4, a connection 12' for introducing foreign gas, for instance for introducing nitrogen ($N_2$), a connection 11' for introducing foreign agents, such as alcohol or the like, a superfine filter 3, and a flow reducer 2, for instance in the form of a throttle. Located in the steam boiler 5 is deionized water 18, which is introduced wither via a direct water inlet 8, for instance in non-continuous operation, or via an inflow line 19. For the continuous mode of operation, this inflow line 19 communicates with a water connection 15 and with a water pressure pump 14 and a water inlet valve 13. Located in the water bath of the steam boiler 5 is a heater 6, in particular an electric heater, by means of which the water bath is heated via a heater regulator 7 with a temperature sensor 20. The steam boiler 5 is also provided with a connection 12 for introducing foreign gas and a connection 11 for introducing a foreign agent, as well as a steam pressure switch 10 and an overpressure valve 9. In this way, both superheated steam and wet steam can be generated, the latter for instance by supplying water via the connection 11'.

Figure 2A:
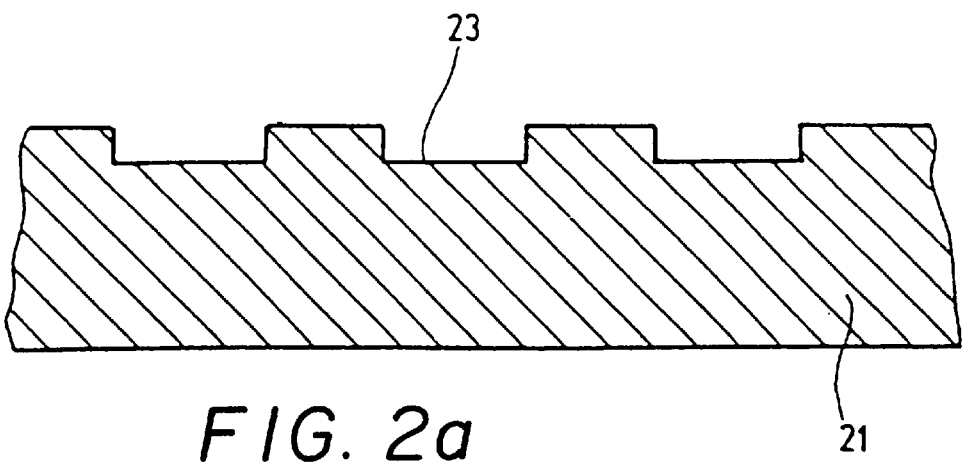
FIGS. 2a–2c, a process sequence for coating and planarizing a silicon wafer.
Figure 2B:
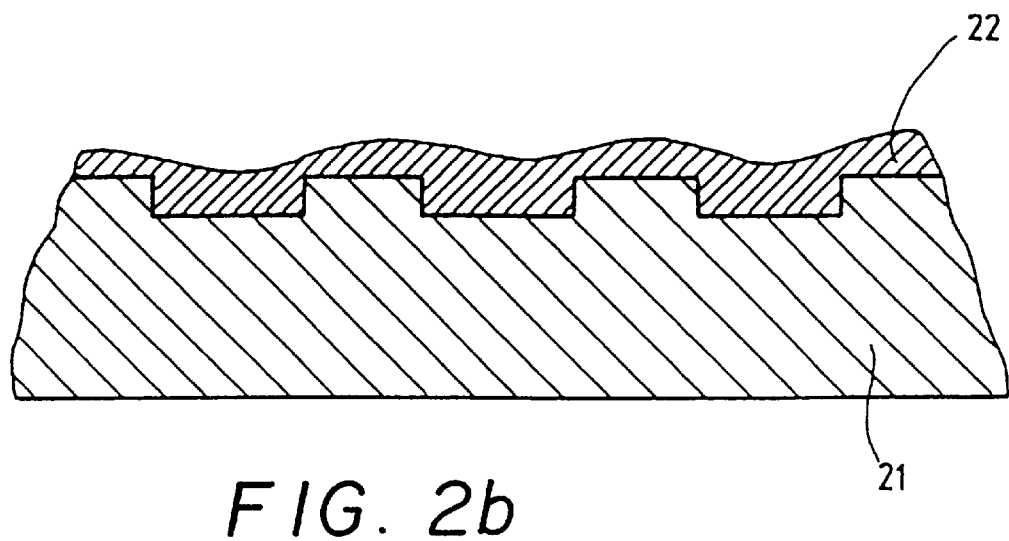
Figure 2C:
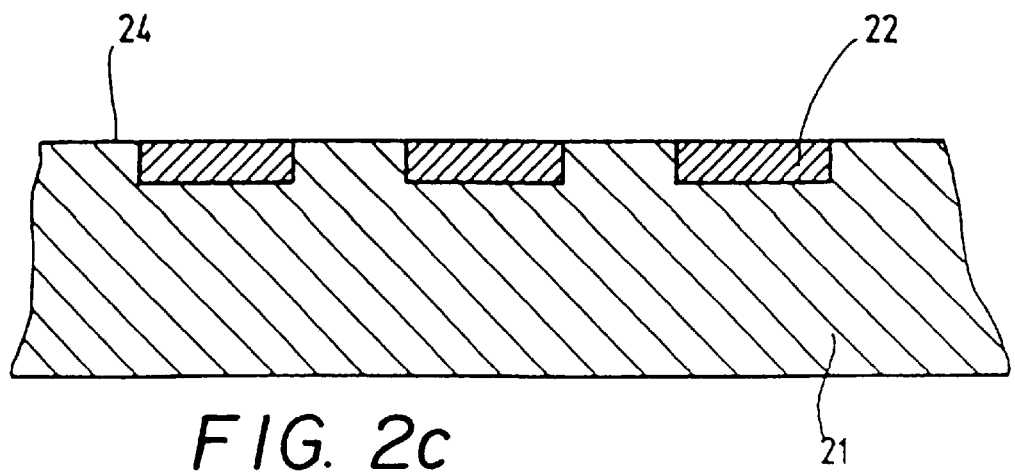

In wafer manufacture, the structure surface of a silicon wafer 21 is coated with a planarizing layer, which for instance comprises $SiO_2$. The structure surface, which has been produced by exposure to light and ensuing etching, is shown in FIG. 2a. FIG. 2b shows the surface coated with the planarizing layer 22; it can clearly be seen that the surface of this planarizing layer 22 is not plane. Via an ensuing grinding or lapping process (CMP process), the planarizing layer 22 is ground down far enough that only the indentations 23 in the surface of the silicon wafer 21 are filled. In this operation, a very fine grinding agent (slurry) is used, but the individual slurry particles still stick to the surface or are embedded in indentations of the surface 60 after the grinding process is finished. The surface shown at 24 in FIG. 2c must then be decontaminated for further processes, or in other words freed of any contamination whatever.

Figure 3:
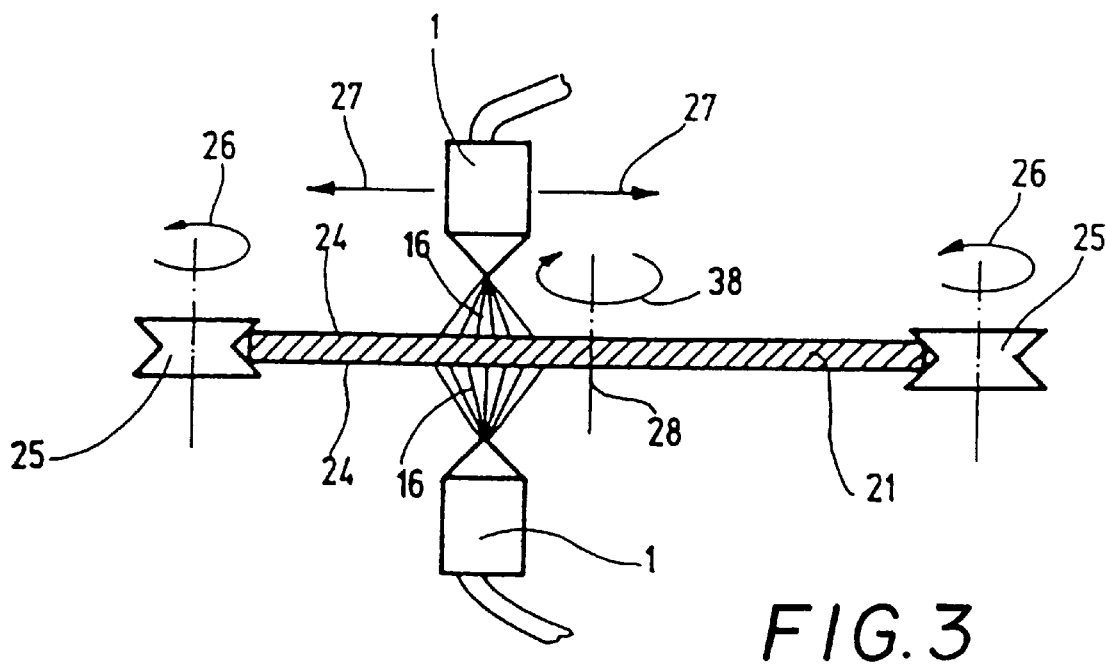
FIG. 3, is a first embodiment of the cleaning device according to the present invention.

FIG. 3 shows a first exemplary embodiment of the cleaning device according to the present invention, which is embodied for instance for holding silicon wafers 21, which have a round disklike shape. The silicon wafer 21 or the substrate 21 is fastened in the region of its edges in at least three diabolo-shaped drive rollers 25 which are rotatably supported in the direction of the arrow 26. In this way, the substrate 21 can be moved without damage to or contact with the surface 24. The two surfaces 24 are sprayed with steam 16 via spray nozzles 1 from above and below. The spray nozzle 1 can be moved, each via a suitable device, radially in the direction of the arrows 27 or in some other way between the center 28 and the edge of the surface 21, and they are spaced apart from the surface 24 by approximately 1 mm. As a result, the entire surface 24 can be treated with steam 16.

The steam 16 emerging from the nozzle 1 strikes the surface 24, so that the contaminants adhering to the surface 24 or located in indentations of it are loosened by the kinetic energy. If wet steam 16 is sprayed on the surface, then the contaminants are loosened by the liquid droplets striking them or by the kinetic energy of these droplets. The water vapor also condenses on the surface and is partly re-evaporated by the steam that follows it, with the vapor bubbles collapsing immediately afterward or bursting at the surface of the substrate. These impulsive forces cause further loosening of the particles. Moreover, the substrate 21 and the individual particles are heated to different extents, causing thermal strains that lead to still further loosening.

The advantage of this method according to the present invention resides in the very low consumption of media, and the effect of the pulses, heat and impulsive force bring about very effective cleaning. The cleaning force effect is also readily controllable by suitable variation of the steam pressure, quantity of incident steam, steam temperature, spacing between steam nozzle and substrate surface, and thickness of the water film as well as by the metering of foreign agent or foreign gas. The cleaning is effected by means of deionized water, so that no disposal problems occur and the entire method is environmentally friendly. The drying can be done by blowing hot steam 16 or by supplying foreign gas. The pressure is regulated by the temperature of the water in the temperature range from 100° C. to approximately 200° C., which is equivalent to a pressure range up to about 10 bar.

Figure 4:
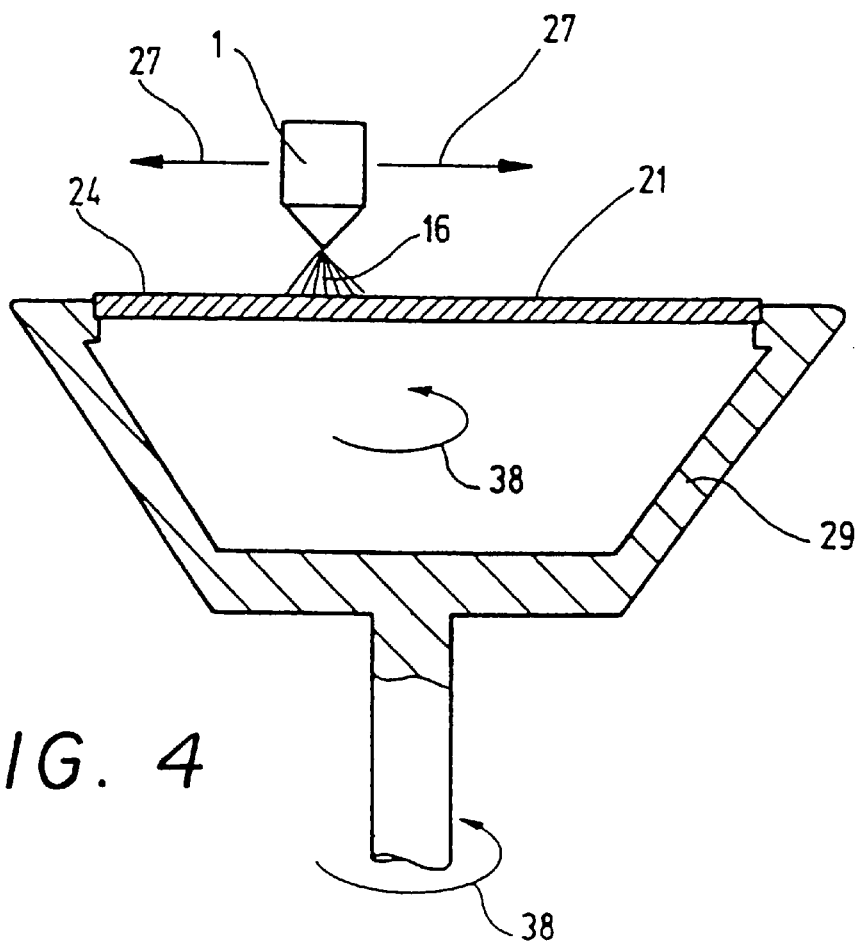

FIG. 4 shows another embodiment of the cleaning device according to the present invention, in which the substrate 21 is fastened in a rotary mount 29. The rotary mount 29 can also hold substrates 21 that are not circular and engages them in the region of their edge. In this embodiment, the upward-pointing surface 24 is cleaned by means of the nozzle 1.

FIG. 5 shows a first embodiment of a transport device 30 for moving the substrate 21 in the direction of the arrow 31. Top this end, the transport device 30 has a steam conduit 32, which is provided on its top with many steam nozzles 33. These steam nozzles 33 are inclined slightly in the direction of the arrow 31, so that steam 16 emerging from the steam conduit 32 forms a steam cushion 34 under the substrate 21 and transports it in the direction of the arrow 31. In this way, the substrate 21 can be moved without being touched in a once-through passage through a cleaning station, with the substrate 21 floating on a cushion 34 of steam and water. The lateral guidance is effected via boundary strips, as shown in FIG. 7.

The transport device 30, in addition to transport portions shown in FIG. 5 also has portions 36 in which the substrate 21 is rotated, which is shown in FIG. 6. Steam nozzles 33 are also provided in these portions 36, but their exit direction is inclined substantially upward and at a tangent around the center 28 and optionally extends in inclined fashion outward, as shown in FIG. 6, in the direction of the edge of the substrate 21. In this way, the substrate is rotated about the center 28 in the direction of the arrows 38. The positioning of the substrate 21 is effected via boundary pins 39, which are disposed so as to be lowerable in the portion 36. If the boundary pins 39 have been extended, as shown in FIGS. 6 and 7, then the substrate 21 is impeded from being transported further in the direction of the arrow 31 and is firmly held in the portion 36. The boundary pins 39 may also themselves be rotatably supported. In that case, the cleaning of the surface or surfaces 24 of the substrate 21 can take place in the portion 36.

FIG. 8 shows a modified embodiment of a transport portion 40 of a transport device 30; the substrate 21 is disposed substantially between two steam conduits 32, and both surfaces are acted upon by steam 16 emerging from steam nozzles 33. The substrate 21 is thus embedded between two steam cushions 34 and is moved in the direction of the arrow 31.

In FIG. 9, an alternative cleaning portion 41 of the transport device 30 is shown, in which the substrate 21 is firmly held via the boundary pins 39 and rotated by means of the steam nozzles 37, as described for FIGS. 6 and 7. The steam nozzles 37, as also already shown in the exemplary embodiment of FIGS. 6 and 7, may simultaneously act as spray nozzles 1, or in other words for cleaning the surfaces 24 of the substrate 21. The detached dirt particles and the incident water can be removed, as shown in FIG. 10, via conduits 42 that are provided in the lower steam conduit 32. To that end, the conduits 32 and/or 42 are inclined.

FIG. 11 schematically shows one such once-through device, in which the substrate 21 is placed on the transport device 30 and transported in the direction of the arrow 31. The portion 35 serves to transport the substrate 21, and the portion 36 serves to clean it. Reference numeral 43 schematically indicates a spin dryer, in which the substrate 21 is set into rapid rotation (about 1500 rpm) in the direction of the arrow 44. Via suitable manipulators 45, the substrate 21 is removed from the spin dryer 43 and placed for instance in cassettes or magazines (not show) and prepared for further transportation in the direction of the arrow 31.

In FIG. 12, a cleaning method is shown in which the substrate 21 has water 18 sprayed on it via a water lance 46, thus creating a water film 47 on the surface 24 of the substrate 21. Via the water lance 46, the water 18 is fed onto the surface 24 at the center 28, so that the water 18 runs off in the direction of the arrows 48 in the form of a water film 47. At the same time, the spray nozzle 1 sweeps over the surface 24 in the direction of the arrow 27 and sprays steam 16 directly into the water film 47. Vapor bubbles thus form in the water film 47, which either immediately collapse again or burst at the surface of the water film 47. Along with the pulsing action of the water vapor 16, the particles 49 also undergo the impulsive action of these vapor bubbles, and are loosened or detached in this way from the surface 24. They are then carried away along with the outflowing water film 47.

In the embodiment of FIG. 13, the substrate 21 is inclined at an angle α and is transported in the direction of the arrow 31 via transport rollers 50, only two of which are shown. Once again, water 18 for forming a water film 47 is applied to the surface 24 of the substrate 21 via the water lance 46. Via the spray nozzle 1, water vapor 16 is blown into this water film 47, as in the exemplary embodiment of FIG. 12. In this process, the spray nozzle 1 is moved orthogonally to the plane of the drawing, or the spray nozzle 1 may be embodied as a wide-slit nozzle, as shown in FIG. 15.

In the exemplary embodiment of FIG. 14, the substrate 21 is disposed flat and is also transported via rollers 50 in the direction of the arrow 31. Once again, via the lance 46, water 18 for forming a water film 47 is applied to the surface 24, and steam 16 is blown into the water film 47 via the nozzle 1. The plan view shown in FIG. 15 shows that both the water lance 46 and the nozzle 1 are embodied as wide-slit nozzles. This arrangement is excellently suited to the once-through method, and the substrate 21 is handled gently.

In closing it should also be pointed out that this method and a corresponding device can be retrofitted easily in existing grinding systems and can readily replace existing cleaning device.

I claim:

1. A method for cleaning contaminated surfaces with water and steam, comprising the steps of:

applying a water film to the contaminated surface; and spraying steam into the applied water film while continuing to apply water to the water film, wherein the steam is applied through at least one steam nozzle and the water is applied through a separate device, and wherein the steam is directed into the water film and through the water film onto the contaminated surface, wherein contaminates in the contaminated surface are removed.

2. The method as defined in claim 1, wherein the steam is selected from the group consisting of superheated steam and wet steam.

3. The method as defined in claim 1, wherein the water film is comprised of deionized water.

4. The method as defined in claim 1, further comprising the step of:

adding gas and/or liquid to the steam and the water film.

5. The method as defined in claim 1, wherein the contaminated surfaces each define a center and an edge, and wherein the cleaning process takes place from the center of each surface toward their respective edges.

6. The method as defined in claim 1, further comprising the step of:

rotating the contaminated surface to be cleaned.

7. The method as defined in claim 1, wherein the contaminated surface defines an edge, and wherein said steam and said water are applied orthogonally to the contaminated surface.

8. The method as defined in claim 1, further comprising the step of:

drying the contaminated surface after cleaning by a spin dryer.

9. The method as defined in claim 1, wherein the contaminated surface moves in a once-through passage through a cleaning station.

10. The method as defined in claim 1, wherein the steam is sprayed onto the contaminated surfaces at a pressure of up to 10 bar.

11. The method as defined in claim 1, wherein the cleaning process is employed in one or more of the following: chemical-mechanical-polishing processes, mask reduction, film production, liquid-crystal-display production, hard-disk manufacture, micro mechanics reading heads for hard disks.

12. The method as defined in claim 1, wherein the contaminated surface defines an edge, and wherein said steam and said water are applied obliquely of the edge of the contaminated surface.

13. The method as defined in claim 4, wherein the gas is nitrogen, and the liquid is selected from the group consisting of alcohols and detergents.

\* \* \* \* \*